(12) United States Patent
Kawanaka et al.

(10) Patent No.: US 8,921,920 B2
(45) Date of Patent: Dec. 30, 2014

(54) SEMICONDUCTOR DEVICE (75) Inventors: Shigeru Kawanaka, Yokohama (JP);
Kosuke Tatsumura, Kawasaki (JP);
Naoki Yasuda, Yokohama (JP); Jun Fujiki, Yokohama (JP); Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 13/418,620

(22) Filed: Mar. 13, 2012

(65) Prior Publication Data

US 2012/0326224 A1 Dec. 27, 2012

(30) Foreign Application Priority Data

Jun. 23, 2011 (JP) .................. 2011-139794

(51) Int. Cl.
| | |
|---|---|
| *H01L 29/792* | (2006.01) |
| *H01L 21/28* | (2006.01) |
| *G11C 11/22* | (2006.01) |
| *G11C 11/412* | (2006.01) |
| *G11C 14/00* | (2006.01) |
| *H01L 29/51* | (2006.01) |
| *H01L 27/11* | (2006.01) |
| *H01L 27/115* | (2006.01) |
| *H01L 27/118* | (2006.01) |

(52) U.S. Cl.
CPC .......... *H01L 21/28282* (2013.01); *G11C 11/22* (2013.01); *G11C 11/412* (2013.01); *G11C 14/0081* (2013.01); *H01L 29/518* (2013.01); *H01L 27/1104* (2013.01); *H01L 27/1156* (2013.01); *H01L 27/11568* (2013.01); *H01L 27/11807* (2013.01); *H01L 29/792* (2013.01)
USPC .................................. 257/324; 257/E29.309

(58) Field of Classification Search
CPC ................ H01L 29/513; H01L 29/792; H01L 21/28282; H01L 29/518; H01L 29/66833; H01L 21/0214
USPC .......................................... 257/324, E29.309
See application file for complete search history.

(56) References Cited

U.S. PATENT DOCUMENTS 5,196,912 A * 3/1993 Matsumoto et al. ............ 257/16
5,488,579 A * 1/1996 Sharma et al. ........... 365/185.08
(Continued)

FOREIGN PATENT DOCUMENTS

JP 2631335 4/1997

OTHER PUBLICATIONS

Shuhei Tanakamura, et al., "A 0.5V Operation, 32% Lower Active Power, 42% Lower Leakage Current, Ferroelectric 6T-SRAM with Vth Self-Adjusting Function for 60% Larger Static Noise Margin", IEDM Tech. Dig., Dec. 2009, 2 pages.

Shosuke Fujii, et al., "A New Method to Extract the Charge Centroid in the Program Operation of Metal-Oxide-Nitride-Oxide-Semiconductor Memories", Japanese Journal of Applied Physics 49, 04DD06, 2 pages, 2010.

(Continued)

*Primary Examiner* — Steven J Fulk
(74) *Attorney, Agent, or Firm* — Oblon, Spivak, McClelland, Maier & Neustadt, L.L.P.

(57) ABSTRACT

A semiconductor device has a semiconductor substrate, and a semiconductor element having an FET on the semiconductor substrate and comprises a different threshold voltage depending on an OFF state and an ON state. The semiconductor element has an insulating film disposed above a part where a channel of the semiconductor substrate is formed, a gate electrode disposed above the insulating film, and a charge trap film disposed between the insulating film and the gate electrode, and to exchange more electrons with the gate electrode than with the channel.

18 Claims, 9 Drawing Sheets

(56) References Cited

U.S. PATENT DOCUMENTS

| | | | |
|---|---|---|---|
| 6,002,610 | A | 12/1999 | Cong et al. |
| 6,198,138 | B1* | 3/2001 | Hirota ............................ 257/368 |
| 6,365,467 | B1* | 4/2002 | Joo ................................ 438/287 |
| 7,215,569 | B2* | 5/2007 | Inaba ............................. 365/154 |
| 2002/0064911 | A1* | 5/2002 | Eitan .............................. 438/216 |
| 2003/0160280 | A1* | 8/2003 | Yoshino ......................... 257/324 |
| 2006/0131672 | A1* | 6/2006 | Wang et al. .................... 257/410 |
| 2008/0006871 | A1* | 1/2008 | Liao ............................... 257/316 |
| 2010/0072535 | A1* | 3/2010 | Takashima et al. ............ 257/324 |

OTHER PUBLICATIONS

N. Goel, et al., "Erase and Retention Improvements in Charge Trap Flash Through Engineered Charge Storage Layer", IEEE Electron Device Letters, vol. 30 No. 3, 2 pages, Mar. 2009.

Yoshiaki Kamigaki, et al., "MNOS Nonvolatile Semiconductor Memory Technology: Present and Future", IEICE Trans. Electron., vol. E84-C, No. 6, 6 pages, Jun. 2001.

* cited by examiner

SEMICONDUCTOR DEVICE

CROSS REFERENCE TO RELATED APPLICATIONS

This application is based upon and claims the benefit of priority from the prior Japanese Patent Application No. 2011-139794, filed on Jun. 23, 2011, the entire contents of which are incorporated herein by reference.

FIELD

Embodiments of the present invention relate to a semiconductor device having an FET.

BACKGROUND

When a gate voltage of an n-type FET exceeds a threshold voltage (Vth), the n-type FET becomes ON state and the resistance between its source and drain is lowered. In a normal FET, Vth is a constant value regardless of whether it is in ON state or OFF state. There has been proposed an n-type FET having a function of reducing Vth when turned on, and increasing Vth again when turned off. This function is called Vth self-adjusting function.

For example, one prior-art discloses an. SRAM utilizing an FET having the Vth self-adjusting function by using a ferroelectric film (hereinafter referred to as Vth self-adjusting FET). By forming an SRAM using the Vth self-adjusting FET, the SRAM can be improved both in data retention characteristics and read characteristics. The disclosed Vth self-adjusting FET has a gate stack formed of a buffer film made of Hf—Al—O on a silicon substrate, an $SrBi_2Ta_2O_9$ (SBT) ferroelectric film on the buffer film, and a Pt metal electrode on the SBT film.

As other conventional techniques, there are disclosed a technique for improving Ioff performance by a nonvolatile programmable switch using a nonvolatile memory Tr, and a high Vth transistor using a power switch FET, and a technique for improving the capture rate and retention rate of high-energy electrons by increasing the film thickness of a charge trap film.

DETAILED DESCRIPTION

A semiconductor device according to one embodiment has a semiconductor substrate, and a semiconductor element configured to comprise an FET which is formed on the semiconductor substrate and comprises a different threshold voltage depending on an OFF state and an ON state, wherein the semiconductor element comprises an insulating film disposed above a part where a channel of the semiconductor substrate is formed, a gate electrode disposed above the insulating film, and a charge trap film disposed between the insulating film and the gate electrode, and to exchange more electrons with the gate electrode than with the channel.

Embodiments will now be explained with reference to the accompanying drawings.

(First Embodiment)

Figure 1:
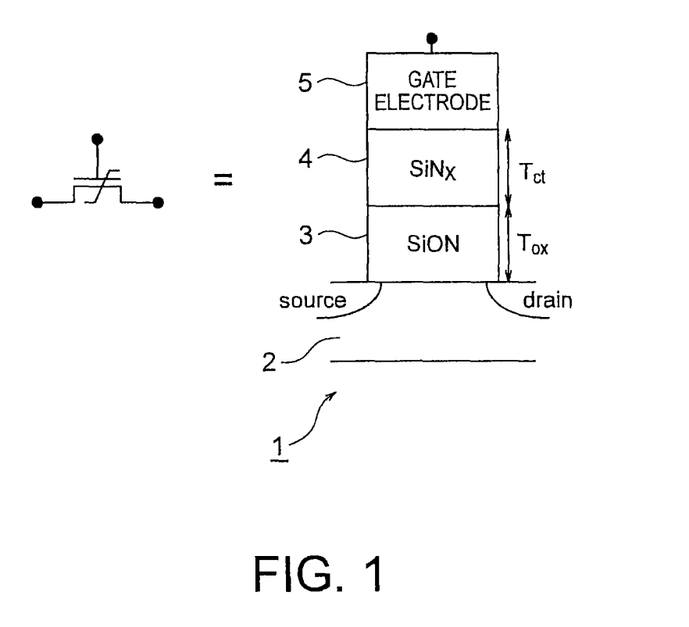
FIG. 1 is a sectional view of a semiconductor device according to a first embodiment.

FIG. 1 is a sectional view of a semiconductor device according to a first embodiment. The semiconductor device of FIG. 1 is a Vth self-adjusting FET 1 capable of automatically adjusting a threshold voltage Vth at ON state and OFF state. The Vth self-adjusting FET 1 of FIG. 1 has a block insulating film 3 formed on a semiconductor substrate 2, a charge trap film 4 formed on the block insulating film 3, and a gate electrode 5 formed on the charge trap film 4. The charge trap film 4 exchanges more electrons with the gate electrode 5 than with a channel formed below the block insulating film 3.

The charge trap film 4 is an SiNx film, and x representing the mole ratio of N to Si has a value within a range of $0.67<x<1.33$. The charge trap film 4 has a film thickness Tct having a value within a range of $0.34\ nm<Tct<7\ nm$.

The block insulating film 3 is an SiON film in which the mole ratio of N to the sum of Si, O, and N expressed as {N/(Si+O+N)} is a value within a range of $0\leq\{N/(Si+O+N)\}<0.35$. The block insulating film 3 has a film thickness Tox having a value within a range of $0.64\ nm<Tox$, preferably within a range of $0.64\ nm<Tox<2.70\ nm$.

The stoichiometric composition of the SiNx film is $Si_3N_4$. In this case, the mole ratio of N to Si is $x=1.33$. The SiNx film satisfying $x<1.33$ has an Si-rich composition in which the composition ratio of Si is high. In this case, Si atoms have dangling bonds, and the dangling bonds generate bipolar traps. Bipolar trap density increases as x gets smaller than 1.33. The bipolar trap, which is neutral when having one electron, is positively charged when releasing the electron, and negatively charged when capturing another electron and having totally two electrons. As will be mentioned later, to obtain a Vth self-adjusting function, it is essential that the charge trap film 4 has bipolar traps. In the present embodiment, $x<1.33$ for the SiNx film forming the charge trap film 4 is an essential condition. In the composition when $x=0.67$, on average, two of four bonds of an Si atom become dangling bonds, or form covalent bonds with adjacent Si atoms. In this case, a large number of covalent bonds are generated, which deteriorates the insulation quality of the SiNx film, and remarkably increases gate leak current. Therefore, it is desirable to satisfy $0.67<x$.

Figure 2:
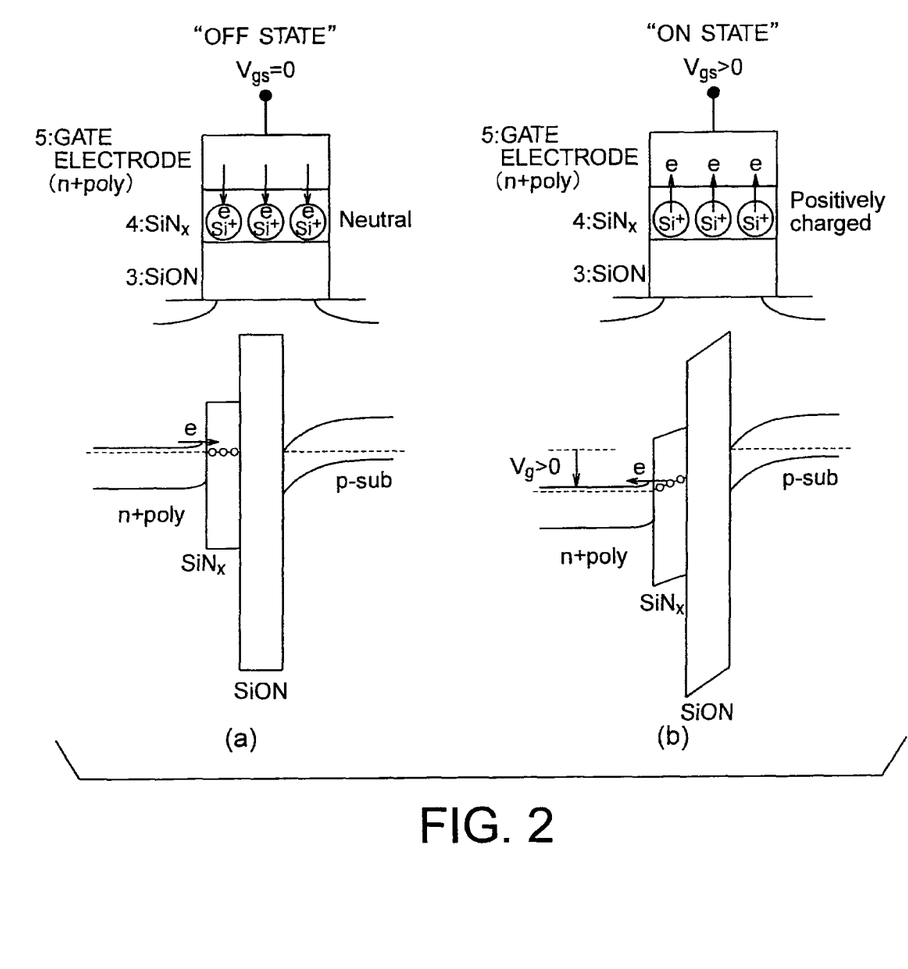
FIG. 2 is a diagram for explaining the operating principle of an n-type FET according to the present embodiment.
Figure 3:
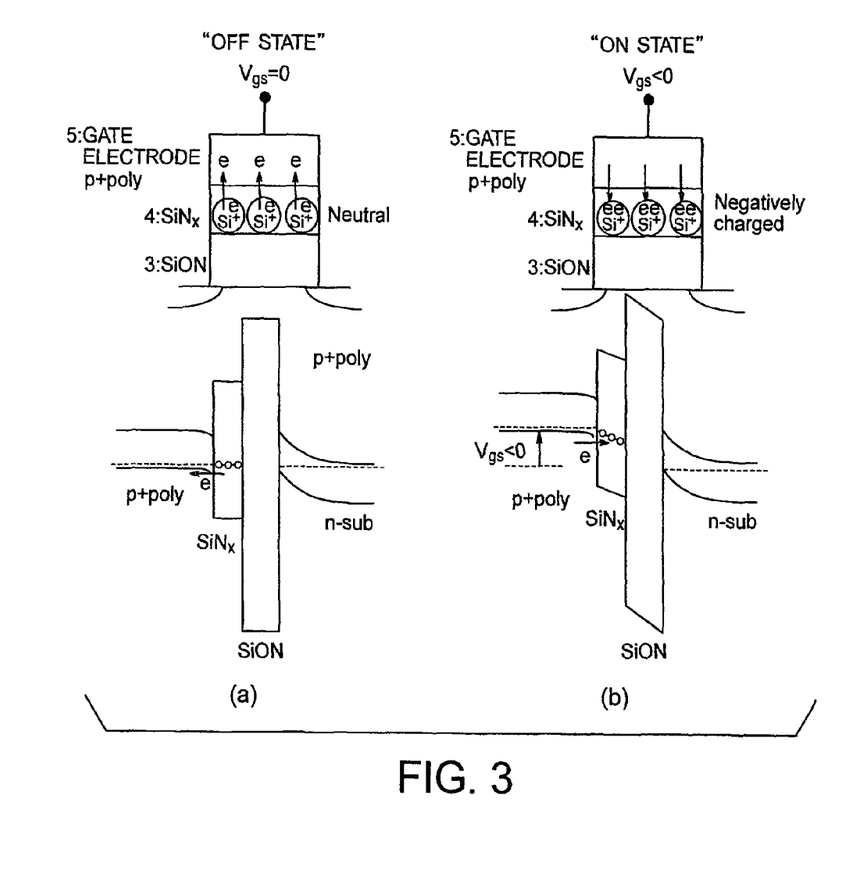
FIG. 3 is a diagram for explaining the operating principle of a p-type FET according to the present embodiment.

Each of FIGS. 2 and 3 is a diagram for explaining the operating principle of the Vth self-adjusting FET 1 according to the present embodiment, in which the moving direction of electrons are shown using a sectional view of the FET and energy band diagram. FIG. 2 shows an example where the FET 1 is n-type and the gate electrode 5 is n+ polysilicon.

More specifically, FIG. 2(a) shows the case where gate-source voltage Vgs=0 V, and the n-type FET is in OFF state. In the case of FIG. 2(a), no electric field is applied in the charge trap film 4. Since bipolar traps in the charge trap film 4 have single electrons, the charge trap film 4 becomes neutral. FIG. 2(b) shows the case where Vgs>0, and the n-type FET is In ON state. In this case, electric field is applied in the charge trap film 4, and due to this electric field, electrons of bipolar traps are extracted toward the gate electrode 5. As a result, positive charge is generated in the charge trap film 4, and Vth of the n-type FET is reduced.

On the other hand, when Vgs in ON state is decreased to return to OFF state, electrons are supplied from the gate electrode 5 to the charge trap film 4 again, and the positive charge in the charge trap film 4 is annihilated. As a result, Vth in OFF state becomes larger than Vth in ON state.

FIG. 3 shows an example where the FET is p-type, and the gate electrode 5 is p+ polysilicon. More specifically, FIG. 3(a) shows the case where gate-source voltage Vgs=0 V, and the p-type FET is in OFF state. In the case of FIG. 3(a), no electric field is applied in the charge trap film 4. Since bipolar traps in the charge trap film 4 have single electrons, the charge trap film 4 becomes neutral. FIG. 3(b) shows the case where Vgs<0, and the p-type FET is in ON state.

When the p-type FET becomes ON state, electric field is applied in the charge trap film 4, and due to this electric field, electrons are injected from the gate electrode 5, and bipolar traps capture the electrons. As a result, negative charge is generated in the charge trap film 4, and |Vth| of the p-type FET is reduced. On the other hand, when Vgs in ON state is increased to return to OFF state, the electrons captured by the charge trap film 4 are emitted to the gate electrode 5, and the negative charge in the charge trap film 4 is annihilated. As a result, |Vth| in OFF state becomes larger than |Vth| in ON state.

As stated above, in both of the n-type FET and the p-type FET, the charge trap film 4 exchanges electrons with the gate electrode 5, which is a characteristic of the Vth self-adjusting FET 1 in the present embodiment. The charge trap film 4 in the present embodiment is directly in contact with the gate electrode 5, in order to exchange electrons with the gate electrode 5 at high speed. Further, in the present embodiment, the block Insulating film 3 is arranged between the charge trap film 4 and the semiconductor substrate 2. This block insulating film 3 reduces the electrons exchanged between the charge trap film 4 and the channel formed around the surface of the semiconductor substrate 2.

In the following example, explanation will be made on an n-type FET unless otherwise noted.

In the first embodiment, the film thickness Tct of the charge trap film 4 is within a range of 0.34<Tct<7 nm. Hereinafter, the reason why the film thickness Tct is limited to this range will be explained.

The basic structure of the SiN charge trap film 4 is an SiN4-based tetrahedral structure, and Si—N bond distance is 0.17 nm. Therefore, one atomic layer has a thickness of 0.34 nm.

Accordingly, in the present embodiment, 0.34 nm<Tct is set as an essential condition for the lower limit of the film thickness Tct of the charge trap film 4.

When the film thickness Tct of the charge trap film 4 is large, the capture rate and retention rate of high-energy electrons are increased. For example, high-energy electrons injected into a thick SiN film are captured in the position 7 nm apart from the injection side, according to Shosuke Fujii, Naoki Yasuda, and Jun Fujiki, "A new method to extract the charge centroid in the program operation of metal-oxide-nitride-oxide-semiconductor memories," Japanese Journal of Applied Physics 49, 04DD06-1 (2010). Therefore, when Tct>7 nm, electrons injected from the semiconductor (channel) side in ON state are captured and retained in the charge trap film 4 with a remarkably higher probability. The electrons captured in the charge trap film 4 act as negative charge, and increases Vth. This is an undesirable Vth change contrary to the intention of the present embodiment. Accordingly, in the present embodiment, Tct<7 nm is set as an essential condition for the upper limit of the film thickness Tct of the charge trap film 4.

Further, in the present embodiment, the block insulating film 3 satisfies the following conditions 1) to 3).

1) The block insulating film 3 formed of SiON is arranged between the charge trap film 4 formed of SiNx and the Si substrate.

2) The block insulating film 3 is an SiON film in which the mole ratio of N to the sum of Si, O, and N expressed as {N/(Si+O+N)} is a value within a range of 0≤{N/(Si+O+N)}<0.35.

3) The film thickness Tox of the block insulating film 3 has a value within a range of 0.64 nm<Tox.

When there is not the block insulating film 3, the charge trap film 4 can exchange electrons not only with the gate electrode 5 but also with the channel in the semiconductor substrate 2. Therefore, the block insulating film 3 is essential to inhibit or reduce the electrons exchanged with the channel.

The content rate of N In the block insulating film 3 can be expressed by the mole ratio of N to the sum of Si, O, and N, as (N/(Si+N+O)). The value of N/(Si+N+O) is 0 in the case of pure $SiO_2$ film, and 0.57 in the case of pure $Si_3N_4$ film. The value of (N/(Si+N+O)) in an SiON gate insulating film used in a normal CMOS manufacturing process is 0 at the minimum, and 0.35 at the maximum. Further, in the present embodiment, an $SiO_2$ film can be used as the block insulating film 3.

As stated above, as long as the composition of the block Insulating film 3 is within a range of 0≤N/(Si+N+O)21 0.35, an SiON gate insulating film used in a normal CMOS manufacturing process can be directly used, and manufacturing is made easier.

In order that the block insulating film 3 fulfills the function of inhibiting or reducing the electrons exchanged between the channel and the charge trap film 4, the film thickness Tox of the block insulating film 3 must satisfy the above condition 3). According to quantum mechanics, a wave function of channel electron penetrates into the insulating film by about 0.5 nm. Therefore, in order to fulfill the above function, thickness of about two atomic layers is required. The block insulating film 3 is formed of SiO4 tetrahedra, SiN4 tetrahedra, or $SiO_yN_{4-y}$ (y: 1, 2, 3) tetrahedra, in which Si—O bond distance is 0.16 nm, and Si—N bond distance is 0.17 nm. This shows that one atomic layer of the block insulating film 3 must have a thickness of 0.32 nm at the minimum.

As stated above, by satisfying the above condition 3), the block insulating film 3 can fulfill the function of inhibiting or reducing the electrons exchanged between the channel and the charge trap film 4. This function can be considered to produce an effect of reducing gate leak current.

In order to further improve the effect of reducing gate leak current by the block insulating film 3, it is desirable that the film thickness Tox of the block insulating film 3 is set to a value within a range of 0.64 nm<Tox<2.70 nm. Hereinafter, grounds for 2.70 nm will be explained.

On the other hand, the charge trap film 4 formed of SiNx is a high-k insulating film having a dielectric constant of 7.9. The barrier height ($\Delta$Ec) of SiNx conduction band having Si-rich composition against Si conduction band is 1.35 eV, according to N. Goel, et.al., "Erase and Retention Improvements in Charge Trap Flash Through Engineered Charge Storage Layer", IEEE Electron Device Letters 30, 216 (2009). Power-supply voltage VDD of a normal LSI is designed so that electric field Fox of the gate insulating film when the FET in LSI is in ON state becomes 5 to 6 MV/cm.

As shown in FIG. 1, when the FET has a layered structure formed of the SiON block insulating film 3 and the SiNx charge trap film 4, if the voltage applied to the SiON block insulating film 3 is defined as Vox, Vox=Fox×Tox. If Vox<$\Delta$Ec, the SiNx charge trap film 4 also functions as an insulating film, and can make a contribution to the reduction in gate leak current. On the other hand, if Vox>$\Delta$Ec, gate leak current is determined only by the SiON block insulating film 3. Therefore, critical thickness Tox_limit of the block insulating film 3 producing an effect of reducing gate leak current becomes as follows, i.e. Tox_limit<$\Delta$Ec/Fox=1.35[eV]/5 [MV/cm]=2.70 nm.

Figure 4:
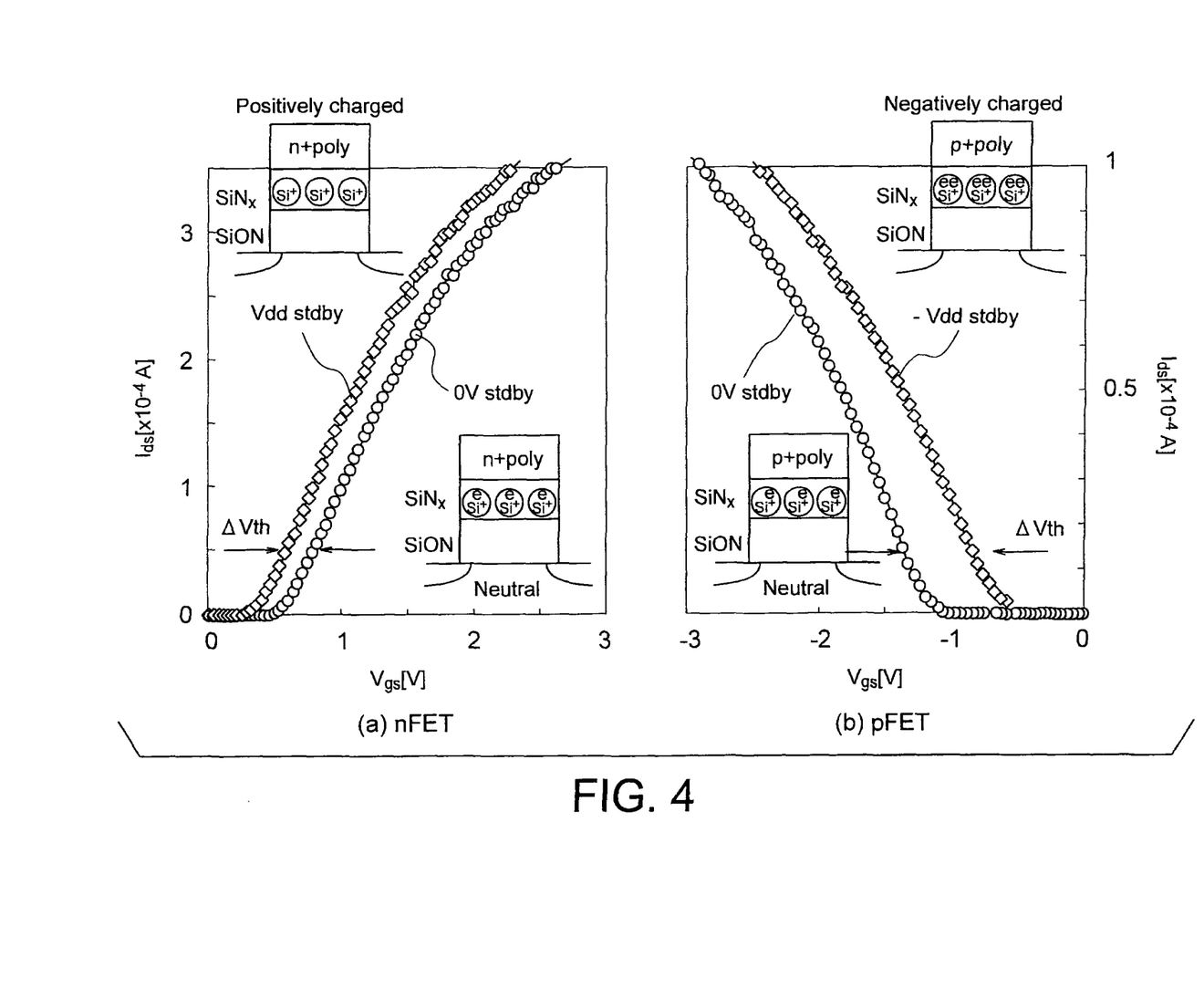
FIG. 4 is a graph showing an experimental result for verifying the operating principle of a Vth self-adjusting FET 1 according to the present embodiment.

FIG. 4 is a graph showing an experimental result for verifying the operating principle of the Vth self-adjusting FET 1 according to the present embodiment.

FIG. 4(a) shows Ids-Vgs characteristics of the n-type Vth self-adjusting FET 1. Tct=2.77 nm, x=1.20, Tox=2.92, N/(Si+O+N)=0, and the gate electrode 5 is n+ polysilicon. In the drawing, IV characteristics described as "0V stdby" and "VDD stdby" are acquired by high-speed pulse IV measurement with a standby Vg of 0V or VDD. The 0V stdby and VDD stdby curves, respectively, correspond to IV characteristics while keeping SiNx charging state in neutral state and positively charged state, and give off-state Vth (Vth_off) and on-state Vth (Vth_on). Here, VDD is set so that the electric field of the gate insulating film becomes 5.5 MV/cm. As verified by the graph of FIG. 4(a), Vth of the n-type FET changes depending on Vgs, and Vth_on becomes smaller than Vth_off.

FIG. 4(b) shows Ids-Vgs characteristics of the p-type Vth self-adjusting FET 1. Tct=2.77 nm, x=1.20, Tox=2.92, N/(Si+O+N)=0, and the gate electrode 5 is p+ polysilicon. The n-type FET of FIG. 4(a) and the p-type FET of FIG. 4(b) are produced through the same manufacturing process excepting the conditions for ion injection. In the drawing, IV characteristics described as "0V stdby" and "−VDD stdby" are acquired by high-speed pulse IV measurement with a standby Vg of 0V or −VDD. The 0V stdby and −VDD stdby curves, respectively, correspond to IV characteristics while keeping SiNx charging state in neutral state and negatively charged state, and give off-state Vth (Vth_off) and on-state Vth (Vth_on). Here, −VDD is set so that the electric field of the gate insulating film becomes 5.5 MV/cm. As verified by the graph of FIG. 4(b), Vth of the p-type FET changes depending on Vgs, and |Vth_on| becomes smaller than |Vth_off|.

The experimental results of FIG. 4(a) and FIG. 4(b) show that both of the n-type FET and the p-type FET can obtain a Vth self-adjusting function by arranging the same block insulating film 3 and the same charge trap film 4 in each FET to generate bipolar traps in the charge trap film 4. Therefore, according to the present embodiment, the block insulating film 3 and the charge trap film 4 can be manufactured through the same process regardless of whether the FET is n-type or p-type, which makes it possible to produce the n-type FET and the p-type FET with a smaller number of processes.

In the n-type FET and the p-type FET according to the present embodiment, n-type polysilicon and p-type polysilicon can be used as materials of their gate electrodes 5. Those are the same as the material of the gate electrode in a conventional FET, which leads to the reduction in material cost.

Further, the gate electrode 5 may be formed of a metal material. In the metal gate formed of a metal material, theoretically, no depletion layer is generated in the gate electrode 5, and thus the current driving force of the FET is not reduced due to the depletion layer, differently from the case of polycrystalline silicon gate. Further, when the metal gate is used in the FET according to the present embodiment, no depletion layer is generated in the interface between the charge trap film 4 and the gate electrode 5, which makes it possible to exchange electrons between the charge trap film 4 and the gate electrode 5 at higher speed. In order not to generate a depletion layer, the gate electrode 5 should be formed of a metal material at least in the part in contact with the charge trap film 4. The metal gate can be formed of a metal material such as TaC, TaN, TiN, TiCN, TiAlN, W, WN, and Mo, selected from refractory metal such as tantalum, titanium, tungsten, and molybdenum and carbide, nitride, or Al compound of the refractory metal.

As stated above, the present embodiment specifies the film thickness, material, and composition of the block insulating film 3 and the charge trap film 4. The film thickness, material, and composition can be made clear when a cross section obtained by cutting from the surface of the gate electrode 5 to a predetermined position of the semiconductor substrate by Focused Ion Beam (FIB) based on a pick-up method is Imaged by high-resolution transmission electron microscopy (HRTEM), or analyzed by Energy Dispersive X-ray Analysis (EDX), Electron Energy-Loss Spectroscopy (EELS), or 3-Dimensional Atom Probe Field Ion Microscopy (3DAP-FIM).

For example, an MNOS (Metal-Nitride-Oxide-Silicon) memory is disclosed by Y. Kamigaki, et.al., IEICE trans. Electron. E84-C, 713 (2001). The MNOS memory has a tunnel insulating film formed on a semiconductor substrate, a charge trap film 4 formed on the tunnel insulating film, and a gate electrode 5 formed on the charge trap film 4. The charge trap film 4 is formed of an SiN film having a film thickness of at least 7 nm and typically 20 nm. The tunnel insulating film is formed of an $SiO_2$ film having a film thickness of typically 1.8 nm.

In an n-type MNOS memory, in write operation, high positive bias is applied to the gate, and electrons injected from the channel are captured in a thick SIN film. As a result, Vth increases. Electric field in the write operation is normally 10 MV/cm or greater. Since the electrons once captured are retained in the SiN film even when the gate bias is turned off, high Vth is kept even when the gate bias is turned off. In erasure operation, the electrons captured in the SIN film are extracted toward the channel by applying high positive bias to the substrate, or applying high negative bias to the gate.

As stated above, in the MNOS memory, electrons are exchanged between the channel and the SiN film in write/erasure operation, and Vth is increased in write operation. On the other hand, In the present embodiment, the block insulating film 3 is arranged between the channel and the charge trap film 4 in order to limit the electrons exchanged between the channel and the charge trap film 4 as much as possible, and electrons are exchanged between the charge trap film 4 and the gate electrode 5 to reduce Vth when the n-type FET is in ON state. As stated above, the MNOS memory and the FET according to the present embodiment are different from each other in both of the structure of the element and operating principle.

It is required for an MNOS memory in write operation to capture high-energy electrons while inhibiting the captured electrons from being emitted toward the gate electrode 5 or the semiconductor. In order to satisfy this function, Tct>14 nm is an essential condition. On the other hand, in the FET according to the present embodiment, Tct<7 nm.

Further, it is required that the tunnel insulating film of the MNOS memory has a film thickness of 2 nm or less and typically about 1.8 nm, in order to ensure a sufficient amount of injected electrons in write operation. This is because direct tunnel current is remarkably increased when the tunnel insulating film has a film thickness of 2 nm or less. On the other hand, the FET in the present embodiment is not particularly required to make the block oxide film thinner, since the FET in the present embodiment does not put out electrons from the channel.

As stated above, the MNOS memory is completely different from the FET according to the present embodiment both in structure and operating principle, and thus naturally produces an effect different from the present embodiment.

As stated above, in the first embodiment, the Vth self-adjusting FET 1 is formed by stacking the block insulating film 3, the charge trap film 4, and the gate electrode 5 so that electrons are exchanged between the charge trap film 4 and the gate electrode 5 while preventing electrons from being exchanged between the charge trap film 4 and the channel by the block insulating film 3. Accordingly, Vth can be reduced when the FET is in ON state to improve driving force performance, and can be increased when the FET is in OFF state to improve cutoff performance.

(Second Embodiment)

A second embodiment is provided to apply the FET explained in the first embodiment to a part of transistors in an SRAM.

Figure 5:
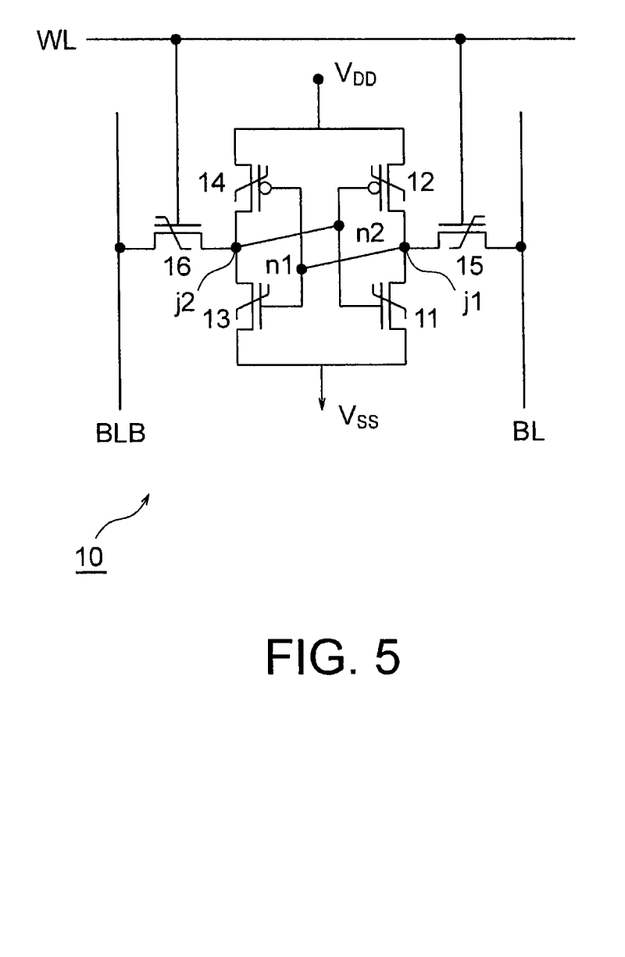
FIG. 5 is a circuit diagram of a semiconductor device according to a second embodiment, and more concretely, a circuit diagram of an SRAM cell.

FIG. 5 is a circuit diagram of a semiconductor device according to the second embodiment, and more concretely, a circuit diagram of an SRAM cell.

An SRAM cell 10 of FIG. 5 has a first n-type FET 11 and a first p-type FET 12 connected in series between a first power-supply line VSS and a second power-supply line VDD, a second n-type FET 13 and a second p-type FET 14 connected in series between the first power-supply line VSS and the second power-supply line VDD, a first junction j1 between the first n-type FET 11 and the first p-type FET 12, a second junction j2 between the second n-type FET 13 and the second p-type FET 14, a first data node n1 connected to the gate of the second n-type FET 13, the gate of the second p-type FET 14, and the first junction j1, a second data node n2 connected to the gate of the first n-type FET 11, the gate of the first p-type FET 12, and the second junction j2, a third n-type FET 15 connected between the first data node n1 and a first data line BL, and a fourth n-type FET 16 connected between the second data node n2 and a second data line BLB.

As stated above, the SRAM cell 10 of FIG. 5 is formed of six FETs 11 to 16, in which four FETs 11 to 14 forms a flip-flop. More specifically, the flip-flop in the SRAM cell 10 has two n-type FETs 11 and 13 serving as pull-down transistors PD, and two p-type FETs 12 and 14 serving as pull-up transistors PU.

Two FETs 15 and 16 not used for the flip-flop in the SRAM cell 10 function as transfer gates TG.

In the present embodiment, each of the two pull-down transistors PD is formed as a Vth self-adjusting FET 1 which is the same as FIG. 1 in structure, material, composition range, and film thickness range, which makes it possible to improve both of data retention characteristics and read characteristics of the SRAM.

The two pull-down transistors PD shift to ON state or OFF state depending on the data retained in the SRAM cell 10 in a complementary manner. The stability of the data retained in the first and second data nodes n1 and n2 in the SRAM cell 10 is increased as Vth of the pull-down transistor PD in OFF state becomes higher.

On the other hand, the read speed of the SRAM increases as Vth of the pull-down transistor PD in ON state becomes lower. When the pull-down transistor PD in the SRAM cell 10 is formed similarly to the Vth self-adjusting FET 1, Vth of the pull-down transistor PD dynamically changes depending on the retained data. Accordingly, it is possible in the SRAM cell 10 that Vth of PD in OFF state is constantly high, while Vth of PD in ON state is constantly low, depending on the retained data, which improves both of data retention characteristics and read characteristics of the SRAM.

Not only the two pull-down transistors PD in the SRAM cell 10 but also each of two transfer gates TG may be formed as an n-type Vth self-adjusting FET 1 having the same structure as FIG. 1, which improves data write characteristics of the SRAM simultaneously.

In order to improve write characteristics, it is important to improve the driving force of the transfer gate TG. When the transfer gate TG is formed similarly to the Vth self-adjusting FET 1, Vth of the transfer gate TG in ON state is reduced, thereby driving force being improved.

Further, in addition to the pull-down transistors PD and the transfer gates TG in the SRAM cell 10, each of the two pull-up transistors PU may be formed as a p-type Vth self-adjusting FET 1 having the same structure as FIG. 1, which makes it possible to reduce static leak current of the SRAM.

When data is retained, one of the n-type FET and p-type FET connected in series between VDD and VSS is in ON state, and the other is in OFF state. By forming PU similarly to the Vth self-adjusting FET 1, Vth of the p-type FET in OFF state is increased, thereby cutoff performance being improved. In this way, leak current flowing between the first and the second power-supply lines VDD and VSS can be reduced.

Further, each of all the transistors PD, PU, and TG forming the SRAM cell 10 may be formed as a Vth self-adjusting FET 1 having the same structure as FIG. 1. In this case, the structure of the block insulating film 3 and the charge trap film 4 in each transistor is the same. Therefore, the block insulating film 3 of every transistor in the SRAM cell 10 can be produced by one process, and the charge trap film 4 also can be similarly produced by one process. Accordingly, the number of manufacturing processes of the SRAM cell 10 can be considerably reduced, which leads to the reduction in production cost.

In the second embodiment, the film thickness Tct of the charge trap film 4 is within a range of 0.45<Tct<2.45 nm, preferably within a range of 0.72 nm<Tct<2.00 nm. Hereinafter, grounds for these numerical ranges will be explained.

When at least a part of transistors in the SRAM cell 10 are formed similarly to the Vth self-adjusting FET 1 of FIG. 1, it is desirable that Vth modulation amount (ΔVth) is within a range of 50 mV<ΔVth<200 mV, preferably about 100 mV.

Variation in Vth among the FETs forming the SRAM is typically $\sigma_{Vth}$=50 mV. In order to obtain a significant effect by the Vth self-adjusting function, it is required that ΔVth>$\sigma_{Vth}$=50 mV. In an SRAM formed of the Vth self-adjusting FETs 1, optimum ΔVth is about 100 mV, according to Shuhei Tanakamaru, Teruyoshi Hatanaka, Ryoji Yajima, Mitsue Takahashi, Shigeki Sakai and Ken Takeuchi, IEDM Tech. Dig., p283 (2009). When ΔVth is 200 mV or greater, write characteristics deteriorate.

Figure 6:
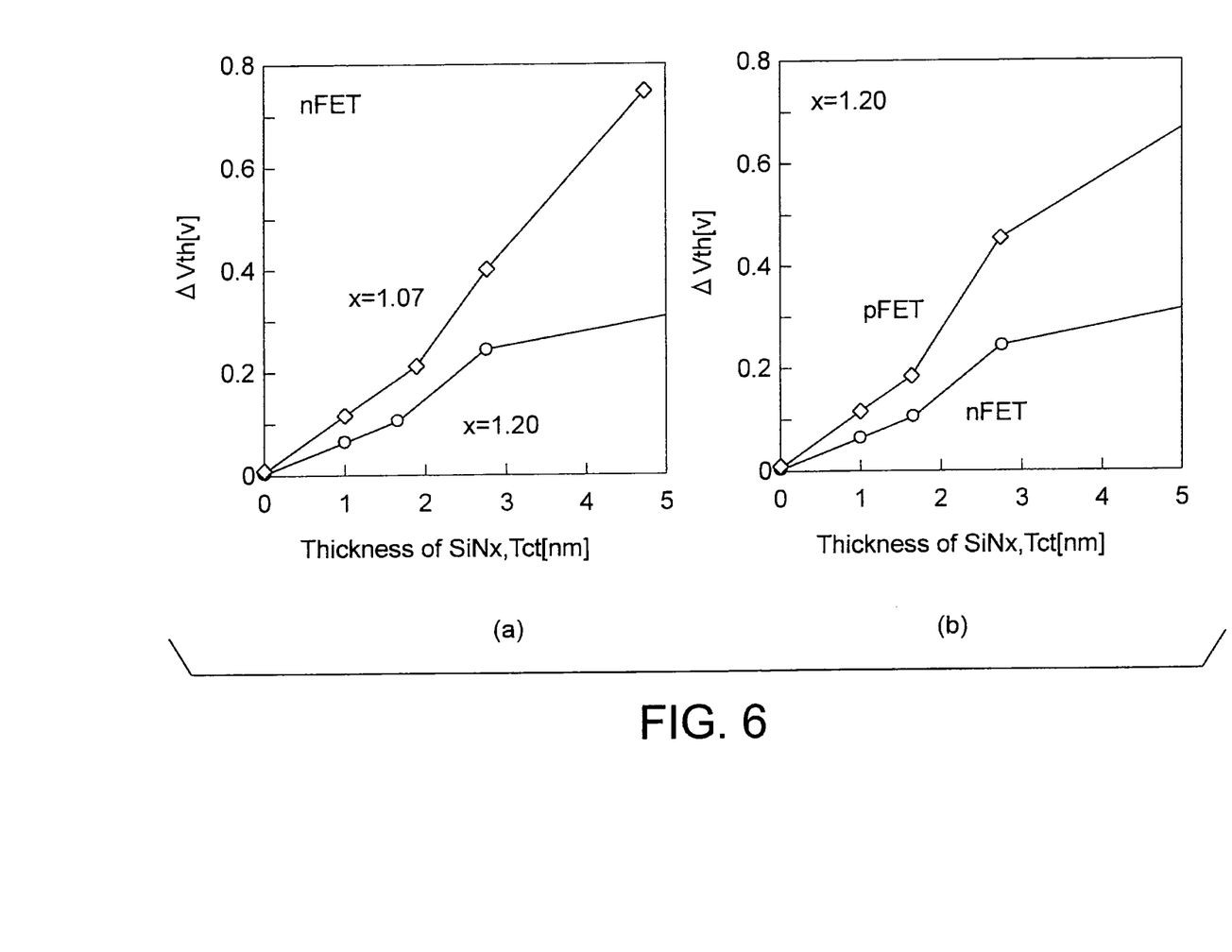
FIG. 6 is a graph showing an experimental result on the relationship between ΔVth and film thickness Tct of an SiNx film.

FIG. 6 is a graph showing an experimental result on the relationship between ΔVth and the film thickness Tct of the SiNx film. FIG. 6(a) is a graph showing the relationship between ΔVth and Tct when x=1.07 and x=1.20 in the SiNx film of the n-type Vth self-adjusting FET 1. FIG. 6(b) is a graph showing the relationship between ΔVth and Tct when x=1.20 in the SiNx film in each of the n-type Vth self-adjusting FET (n-FET) and the p-type Vth self-adjusting FET (p-FET).

According to the graph of FIG. 6(a), the SiNx film thickness Tct in the n-type FET when applying ΔVth=50 mV, 100 mV, and 200 mV is as follows, i.e. Tct=0.83 nm, 1.66 nm, and 2.45 nm when x=1.20, and Tct=0.45 nm, 0.90 nm, and 1.80 nm when x=1.07.

According to the graph of FIG. 6(a), it is desirable that 0.45 nm<Tct<2.45 nm in the SRAM formed of the Vth self-adjusting FETs 1. Further, in order to obtain optimum ΔVth, which is ±20% of 100 mV, it is desirable that 0.72 nm<Tct<2.00 nm.

In the second embodiment, it Is desirable that the film thickness Tox of the SiON block insulating film 3 is within a range of 0.64 nm<Tox<2.70 nm, preferably within a range of 0.87 nm<Tox<2.70 nm, and more preferably within a range of 1.09 nm<Tox<2.70 nm. Hereinafter, grounds for these numerical ranges will be explained.

Figure 7:
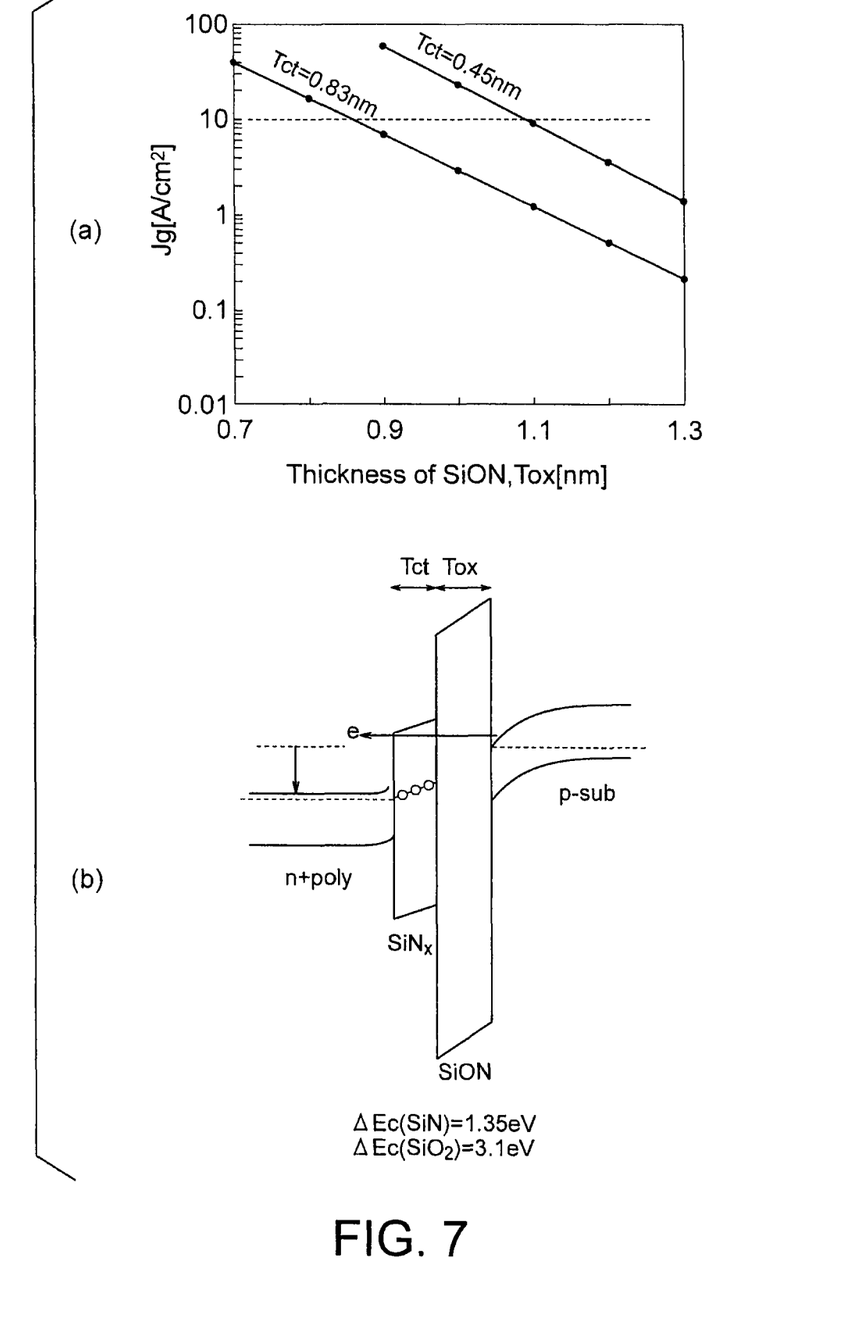
FIG. 7 is a diagram showing the relationship between gate leak current Jg and film thickness Tox of an SiON block insulating film 3 in a stacked gate including the SiON block insulating film 3 and an SiNx charge trap film 4.

FIG. 7 is a diagram showing the relationship between gate leak current Jg and the film thickness Tox of the SiON block insulating film 3 in a stacked gate including the SiON block insulating film 3 and the SiNx charge trap film 4. FIG. 7(a) shows a Jg-Tox graph when the film thickness Tct of the SiNx charge trap film 4 is 0.45 nm and 0.83 nm. FIG. 7(b) is an energy band diagram of the above stacked gate.

In FIG. 7(a), the gate leak current Jg is calculated using WKB approximation, based on the assumption that ΔEc(SiNx)=1.35 eV, and ΔEc(SiO$_2$)=3.1 eV. The gate leak current Jg of the SRAM should be made 10 A/cm$^2$ or less. According to FIG. 7(a), the value Jg=10 A/cm$^2$ is satisfied by Tox=0.87 nm when Tct=0.83 nm, and Tox=1.09 nm when Tct=0.45 nm. Therefore, if 0.83 nm<Tox, Jg<10 A/cm$^2$ even when Tct is 0.83 nm. Further, if 1.09 nm<Tox, Jg<10 A/cm$^2$ even when Tct is 0.45 nm.

In the second embodiment, the body contact (substrate potential) of the pull-down transistors PD and the transfer gates TG each serving as an n-type FET is connected to VSS, and the body contact of the pull-up transistors PU each serving as a p-type FET is connected to VDD. Therefore, the p-n junction between the substrate and source, or between the substrate and drain satisfies reverse bias conditions, which prevents the flow of great leak current. On the other hand, in the above-mentioned document of Shuhei Tanakamaru, Teruyoshi Hatanaka, Ryoji Yajima, Mitsue Takahashi, Shigeki Sakai and Ken Takeuchi, IEDM Tech. Dig., p283 (2009), the body contact of n-type FETs forming a flip-flop in an SRAM cell is connected to VDD, and the body contact of p-type FETs is connected to VSS, which causes great leak current to flow from the substrate to the source/drain region.

Further, in the second embodiment, it is assumed that an n-type polysilicon film is used as the gate electrode 5 of the n-type FET forming each of the pull-down transistors PD and the transfer gates TG, and a p-type polysilicon film is used as the gate electrode 5 of the p-type FET forming each of the pull-up transistors PU, which shows that the material of the gate electrode 5 is the same as a normal SRAM cell 10. As already explained in the first embodiment, the Vth self-adjusting FET 1 of FIG. 1 can be produced even when the gate electrode 5 is formed of a polysilicon film. Therefore, the SRAM cell 10 according to the second embodiment can be produced with an inexpensive material, and thus the total production cost including material cost can be reduced.

Note that the material of the gate electrode 5 should not be necessarily limited to polysilicon. For example, a metal material may be used in the gate electrode 5 of the n-type FET serving as the pull-down transistor PD and transfer gate TG, and in the gate electrode 5 of the p-type FET serving as the pull-up transistor PU. In this case, it is possible to use a metal gate formed of a material such as TaC, TaN, TiN, TiCN, TiAlN, W, WN, and Mo, selected from refractory metal such as tantalum, titanium, tungsten, and molybdenum, and carbide, nitride, or Al compound of the refractory metal.

As stated above, in the second embodiment, at least a part of six transistors forming the SRAM cell 10 are formed similarly to the Vth self-adjusting FET 1 of FIG. 1, which makes it possible to improve the data retention characteristics, data read characteristics, and data write characteristics of the SRAM as needed, and to reduce leak current.

(Third Embodiment)

A third embodiment is provided to realize a programmable switch using the Vth self-adjusting FET 1 of FIG. 1. The programmable switch is for controlling the switching between ON/OFF state of an FET functioning as a switch, depending on the data retained in a memory connected to the gate of the switch FET. A typical FPGA (Field Programmable Gate Array) is an array formed of logic elements and programmable switches. Each programmable switch functions to selectively connect the logic elements.

Figure 8:
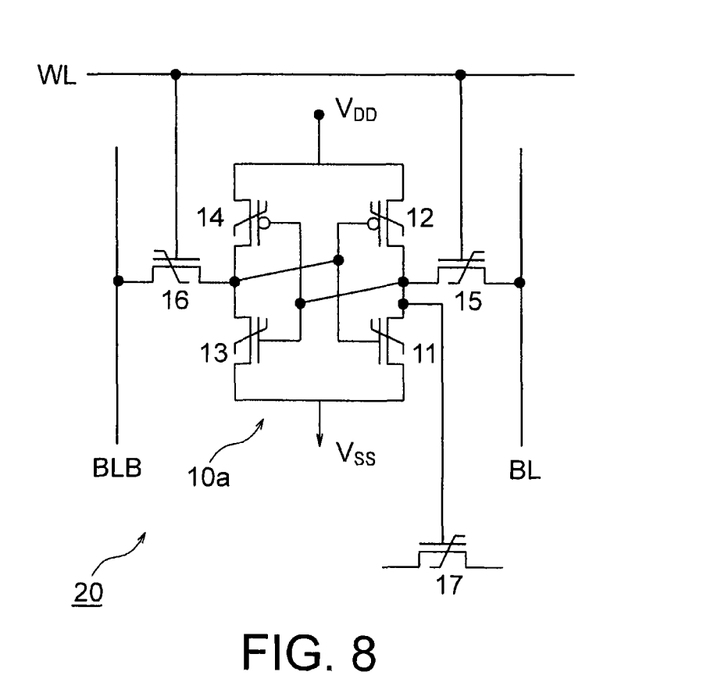
FIG. 8 is a circuit diagram of a semiconductor device according to a third embodiment.

FIG. 8 is a circuit diagram of a semiconductor device according to the third embodiment. The semiconductor device of FIG. 8 is a programmable switch 20 having an n-type FET (hereinafter referred to as switch FET) 17 for switching ON/OFF, an SRAM cell 10a for storing data to be applied to the gate of the switch FET 17.

The switch FET 17 is turned on or off depending on the data retained in the SRAM cell 10a. Since the data retained in the SRAM cell 10a can be rewritten, the circuit of FIG. 8 functions as the programmable switch 20.

The circuit configuration of the SRAM cell 10a in FIG. 8 is the same as FIG. 5, but there is no need that each transistor in the SRAM cell 10a is formed similarly to the Vth self-adjusting FET 1, and thus the SRAM cell 10a may be a normal SRAM cell 10a.

The switch FET 17 of FIG. 8 is the Vth self-adjusting FET 1 of FIG. 1, and the charge trap film 4 and the block insulating film 3 In this FET are the same as those explained in the first embodiment in material, composition, and film thickness. By forming the switch FET 17 similarly to the Vth self-adjusting FET 1 of FIG. 1, Vth of the switch FET 17 can be automatically reduced when ON state is programmed in the SRAM cell 10a, and Vth of the switch FET 17 can be automatically increased when OFF state is programmed in the SRAM cell 10a. As a result, driving force performance of the switch FET 17 programmed to ON state is improved, and cutoff performance of the switch FET 17 programmed to OFF state is also improved.

Similarly to the second embodiment, at least a part of transistors in the SRAM cell 10a of FIG. 8 may be formed similarly to the Vth self-adjusting FET 1 of FIG. 1. In this case, the programmable switch 20 can produce both the effect of the second embodiment and the effect of the third embodiment.

As stated above, in the third embodiment, when making the programmable switch 20 using the SRAM cell 10a and the switch FET 17, driving force performance and cutoff performance of the switch FET 17 can be improved.

(Fourth Embodiment)

Figure 9:
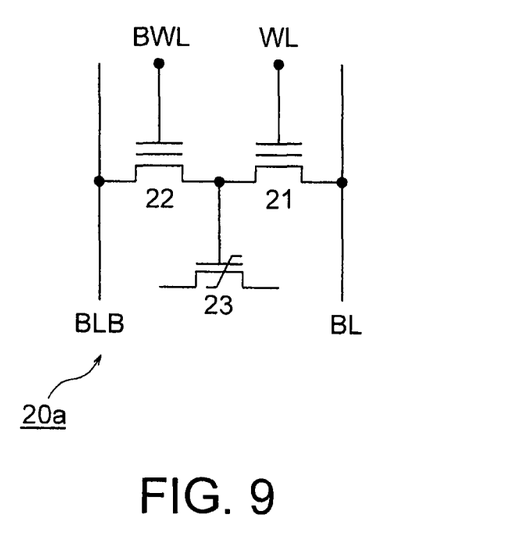
FIG. 9 is a circuit diagram of a semiconductor device according to a fourth embodiment.

A fourth embodiment is provided to realize the programmable switch 20 using a nonvolatile memory instead of an SRAM.

FIG. 9 is a circuit diagram of a semiconductor device according to the fourth embodiment, in which a programmable switch 20a is formed of two nonvolatile memory cells (first and second nonvolatile FETs) 21 and 22, and an n-type FET (hereinafter referred to as switch FET) 23 formed similarly to the Vth self-adjusting FET 1 of FIG. 1.

In the circuit of FIG. 9, one nonvolatile memory cell 21 is connected between the first data line BL and the data node n1, and the other nonvolatile memory cell 22 is connected between the second data line BLB and the data node n1. The data node n1 is connected to the gate of the switch FET 23.

Also in the programmable switch 20a of FIG. 9, by forming the switch FET 23 similarly to the Vth self-adjusting FET 1, both of the driving force performance and cutoff performance of the switch FET 23 can be improved.

Further, by forming the switch FET 23 similarly to the Vth self-adjusting FET 1, high-voltage resistance of the switch FET 23 can be also improved. For example, when an FN (Fowler-Nordheim)-type write method is employed in the nonvolatile memory cells 21 and 22, the switch FET 23 must have a high-voltage resistance. This is because high voltage is applied to the gate of the switch FET 23 of an unselected cell when selectively performing write operation based on the FN-type write method. In order to avoid the breakdown due to high bias, it is normally required to increase the film thickness of the gate insulating film of the switch FET 23. However, in this case, driving force performance of the switch FET 23 deteriorates. By forming the switch FET 23 similarly to the Vth self-adjusting FET 1, driving force performance can be improved while keeping high-voltage resistance equivalent to that obtained by increasing the film thickness of the gate insulating film.

In the fourth embodiment, a SONOS nonvolatile FET can be used as a nonvolatile memory, for example. The SONOS nonvolatile FET has a tunnel insulating film formed on a semiconductor substrate 2, a charge trap film formed on the tunnel insulating film, a block insulating film formed on the charge trap film, a cap film formed on the block insulating film, and a gate electrode formed on the cap film.

The tunnel insulating film of the SONOS nonvolatile FET can be made of an ONO stack formed of $SiO_2/SiN_x/SiO_2$, for example. The charge trap film can be made of an SiNx film having Si-rich composition, for example. The block insulating film can be made of an ONO stack formed of $SiO_2/SiN_x/SiO_2$, for example. Further, the block insulating film can be made of an $Al_2O_3$ film, for example. The cap film can be made of an SIN film. The gate electrode can be made of n-type polysilicon.

As another concrete example of the nonvolatile memory in the fourth embodiment, an FG (Floating Gate)-type nonvolatile FET may be used.

As stated above, in the fourth embodiment, the switch FET 23 in the programmable switch 20a for performing switching operation based on the ON/OFF information stored in the nonvolatile memory is formed similarly to the Vth self-adjusting FET 1 of FIG. 1. Accordingly, the switch FET 23 can have a high-voltage resistance against the high voltage applied upon write operation of the nonvolatile memory, and driving force performance and cutoff performance of the switch FET 23 can be improved.

(Fifth Embodiment)

A fifth embodiment is provided to apply the Vth self-adjusting FET 1 of FIG. 1 to a power gating circuit. Each of FIG. 10 and FIG. 11 is a circuit diagram of a semiconductor device according to the fifth embodiment, showing the circuit configuration of a power gating circuit 30.

The power gating circuit 30 is used to reduce power consumption of an LSI. More concretely, a logic circuit in the LSI is divided into a plurality of logic circuit subblocks 24, whose power supply can be independently controlled by the power gating circuit 30. The power consumption of an LSI is reduced by cutting off the power supply to the logic circuit subblocks 24 in idle state.

Figure 10:
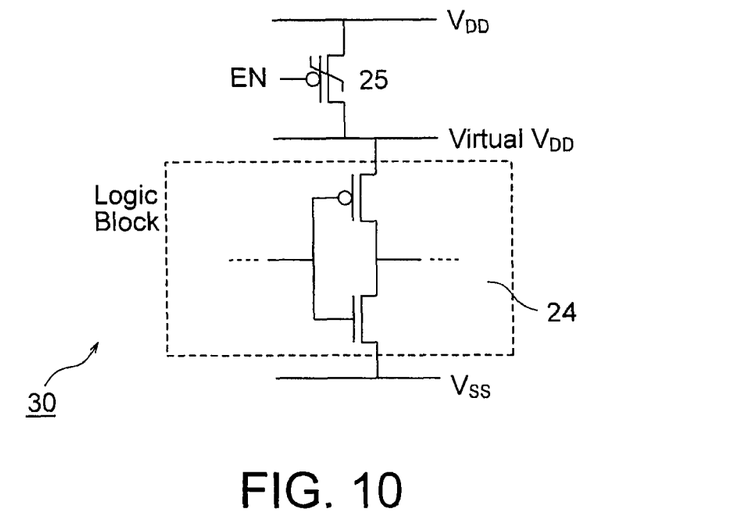
FIG. 10 is a circuit diagram of a semiconductor device according to a fifth embodiment.
Figure 11:
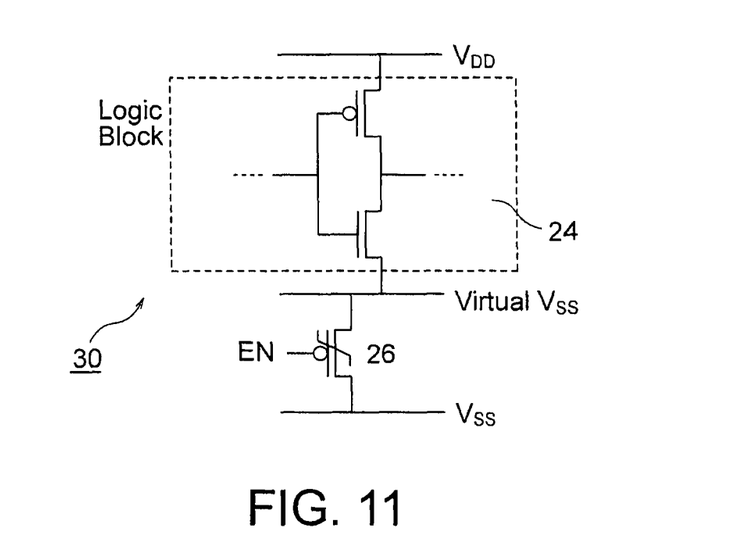
FIG. 11 is a circuit diagram of another semiconductor device according to the fifth embodiment.

As shown in FIG. 10 and FIG. 11, each logic circuit subblock 24 is connected to a virtual power-supply line Virtual-VDD, or to a virtual ground line Virtual-VSS. Each logic circuit subblock 24 has the power gating circuit 30 connected between the power-supply line VDD (ground line VSS) and the virtual power-supply line Virtual-VDD (virtual ground line Virtual-VSS) of the LSI. The power gating circuit 30 of FIG. 10 has a p-type FET (hereinafter referred to as power switch FET) 25 for switching whether or not to supply the voltage of the power-supply line VDD of the LSI to the virtual power-supply line VDD. ON/OFF control of the power switch FET 25 is performed by an enable signal EN. Further, the power gating circuit 30 of FIG. 11 has an n-type FET (power switch FET) 26 connected between the ground line VSS and the virtual ground line VSS of the LSI.

The power switch FETs 25 and 26 shown in FIG. 10 and FIG. 11 are formed similarly to the Vth self-adjusting FET 1 of FIG. 1, and the charge trap film 4 and the block insulating film 3 in each FET are the same as those explained in the first embodiment in material, composition, and film thickness.

Leak current Ioff when the power switch FETs 25 and 26 are turned off determines the leak current in an idle state, and thus extremely high cutoff performance, namely, extremely low Ioff performance is required for the power switch FETs 25 and 26. Further, resistance when the power switch FETs 25 and 26 are turned on determines the voltage drop amount between the power-supply line VDD and the virtual power-supply line Virtual-VDD, or between the virtual ground line Virtual-Vss and the ground line Vss, and thus extremely low on-resistance, namely, extremely high Ion performance is required for the power switch FETs 25 and 26.

In the power gating circuit 30 according to the present embodiment, the power switch FETs 25 and 26 are formed similarly to the Vth self-adjusting FET 1 of FIG. 1, which makes it possible to improve driving force performance when the power switch FETs 25 and 26 are turned on and to improve cutoff performance when the power switch FETs 25 and 26 are turned off. Accordingly, both of the Ion performance and the Ioff performance can be improved. On the other hand, Japanese Patent No. 2,631,335 discloses a technique for improving the Ioff performance by forming a power switch FET as a high Vth transistor. However, Japanese Patent No. 2,631,335 does not focus on the improvement of the Ion performance, and thus does not disclose a technique for improving the Ion performance, although not only extremely low Ioff performance but also extremely high Ion performance is required for the power switch FETs 25 and 26.

As stated above, in the fifth embodiment, the power switch FETs 25 and 26 in the power gating circuit 30 are formed similarly to the Vth self-adjusting FET 1 of FIG. 1, which makes it possible improve both of the Ion performance and the Ioff performance.

When the power switch FETs 25 and 26 are formed similarly to the Vth self-adjusting FET 1, much time is required for ON/OFF switching, compared to a normal FET. This is because electrons are exchanged mainly between the charge trap film 4 and the gate electrode 5. In the case of the power gating circuit 30, power-supply state of the corresponding logic circuit subblock 24 is not frequently switched, and switching the power-supply state at high speed causes a problem that inrush current flows into the logic circuit subblock 24. When the power switch FETs 25 and 26 are formed similarly to the Vth self-adjusting FET 1 as in the present embodiment, each logic circuit subblock 24 can be operated more stably without the fear of inrush current flowing into each logic circuit subblock 24, although much time is required for switching the power-supply state.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device, comprising:
a semiconductor substrate; and
a semiconductor element configured to comprise an FET which is formed on the semiconductor substrate and comprises a different threshold voltage depending on an OFF state and an ON state,
wherein the semiconductor element comprises:
an insulating film disposed above a part where a channel of the semiconductor substrate is formed;
a gate electrode disposed above the insulating film; and
a charge trap film disposed between the insulating film and the gate electrode, and to exchange more electrons with the gate electrode than with the channel,
wherein when the semiconductor element is an n-type FET, the charge trap film sets the threshold voltage to a first voltage level when the semiconductor element is in the OFF state by capturing electrons from the gate electrode and becoming a neutral state, and sets the threshold voltage to a second voltage level lower than the first voltage level when the semiconductor element is in the ON state by transferring electrons to the gate electrode, and
when the semiconductor element is a p-type FET, the charge trap film sets an absolute value of the threshold voltage to a third voltage level when the semiconductor element is in the OFF state by transferring extra electrons to the gate electrode and becoming the neutral state, and sets the absolute value of the threshold voltage to a fourth voltage level lower than the third voltage level when the semiconductor element is in the ON state by capturing electrons from the gate electrode.

2. The semiconductor device of claim 1,
wherein the charge trap film is an SiNx film, the x representing a mole ratio of N to Si and comprising a value within a range of $0.67 < x < 1.33$,
the charge trap film comprises a film thickness Tct comprising a value within a range of $0.34$ nm $< $ Tct $ < 7$ nm,
the insulating film is an SION film in which a mole ratio of N to a sum of Si, O, and N expressed as $\{N/(Si+O+N)\}$ is a value within a range of $0 \leq \{N/(Si+O+N)\} < 0.35$, and
the insulating film has a film thickness Tox comprising a value within a range of $0.64$ nm $<$ Tox.

3. The semiconductor device of claim 1,
wherein the insulating film comprises a film thickness Tox comprising a value within a range of $0.64$ nm $<$ Tox $< 2.70$ nm.

4. The semiconductor device of claim 1,
wherein the gate electrode is an n-type polysilicon film when the semiconductor element is n-type, and is a p-type polysilicon film when the semiconductor element is p-type.

5. The semiconductor device of claim 1,
wherein the gate electrode and the charge trap film are in contact with each other, and
an interface of the gate electrode in contact with the charge trap film comprises a material including at least one of TaC, TaN, TiN, TiCN, TiAlN, W, WN, and Mo.

6. The semiconductor device of claim 1, further comprising:
a first n-type FET and a first p-type FET connected in series between a first power-supply line and a second power-supply line;
a second n-type FET and a second p-type FET connected in series between the first power-supply line and the second power-supply line;
a first junction disposed between the first n-type FET and the first p-type FET;
a second junction disposed between the second n-type FET and the second p-type FET;
a first data node connected to a gate of the second n-type FET, a gate of the second p-type FET, and the first junction;
a second data node connected to a gate of the first n-type FET, a gate of the first p-type FET, and the second junction;
a third n-type FET connected between the first data node and a first data line; and
a fourth n-type FET connected between the second data node and a second data line,
wherein each of the first n-type FET and the second n-type FET comprises a layer structure same as the semiconductor element, and the charge trap film and the insulating film in each of the first n-type FET and the second n-type FET are same as the semiconductor element in material, composition range, and film thickness range.

7. The semiconductor device of claim 6,
wherein the charge trap film in each of the first n-type FET and the second n-type FET comprises a film thickness Tct having a value within a range of $0.45$ nm $<$ Tct $< 2.45$ nm, and
the insulating film is an SiON film in which a mole ratio of N to a sum of Si, O, and N expressed as $\{N/(Si+O+N)\}$ is a value within a range of $0 \leq \{N/(Si+O+N)\} < 0.35$, and
the insulating film comprises a film thickness Tox having a value within a range of $0.64$ nm $<$ Tox $< 2.70$ nm.

8. The semiconductor device of claim 7,
wherein the film thickness Tct of the charge trap film comprises a value within a range of $0.72$ nm $<$ Tct $< 2.00$ nm.

9. The semiconductor device of claim 7,
wherein the film thickness Tox of the insulating film comprises a value within a range of $0.87$ nm $<$ Tox $< 2.70$ nm.

10. The semiconductor device of claim 9,
wherein the film thickness Tox of the insulating film comprises a value within a range of $1.09$ nm $<$ Tox $< 2.70$ nm.

11. The semiconductor device of claim 6,
wherein each of the third n-type FET and the fourth n-type FET comprises a layer structure same as the semiconductor element, and the charge trap film and the insulating film in each of the third n-type FET and the fourth n-type FET are same as the semiconductor element in material, composition range, and film thickness range.

12. The semiconductor device of claim 6,
wherein each of the first p-type FET and the second p-type FET comprises a layer structure same as the semiconductor element, and the charge trap film and the insulating film in each of the first p-type FET and the second p-type FET are same as the semiconductor element in material, composition range, and film thickness range.

13. The semiconductor device of claim 6,
wherein each of the first and second n-type FETs comprises a substrate potential set to a ground potential, and each of the first and second p-type FETs comprises a substrate potential set to a power-supply potential.

14. The semiconductor device of claim 1, further comprising:
a first n-type FET and a first p-type FET connected in series between a first power-supply line and a second power-supply line;
a second n-type FET and a second p-type FET connected in series between the first power-supply line and the second power-supply line;
a first junction disposed between the first n-type FET and the first p-type FET;
a second junction disposed between the second n-type FET and the second p-type FET;
a first data node connected to a gate of the second n-type FET, a gate of the second p-type FET, and the first junction;
a second data node connected to a gate of the first n-type FET, a gate of the first p-type FET, and the second junction;
a third n-type FET connected between the first data node and a first data line; and
a fourth n-type FET connected between the second data node and a second data line; and
a fifth n-type FET configured to comprise a gate connected to the first data node,
wherein the fifth n-type FET comprises a layer structure same as the semiconductor element, and the charge trap film and the insulating film of the fifth n-type FET are same as the semiconductor element in material, composition range, and film thickness range.

15. The semiconductor device of claim 1, further comprising:
a first nonvolatile FET and a second nonvolatile FET connected in series between a first data line and a second data line, each of the FETs being capable of nonvolatilely storing a data bit supplied from its corresponding data line;
a junction disposed between the first nonvolatile FET and the second nonvolatile FET; and
a switch FET configured to comprise a gate connected to the junction, and to be turned on or off depending on the data stored in the first and second nonvolatile FETs,
wherein the switch FET comprises a layer structure same as the semiconductor element, and the charge trap film and the insulating film of the switch FET are same as the semiconductor element in material, composition range, and film thickness range.

16. The semiconductor device of claim 1, further comprising:
a logic circuit block configured to comprise a plurality of FETs;
a virtual power-supply line connected to a reference power-supply terminal of the logic circuit block; and
a power switch FET configured to switch whether or not the virtual power-supply line should be set to a predetermined reference voltage,
wherein the power switch FET comprises a layer structure same as the semiconductor element, and the charge trap film and the insulating film of the power switch FET are same as the semiconductor element in material, composition range, and film thickness range.

17. A semiconductor device, comprising:
a semiconductor substrate; and
a semiconductor element configured to be formed of an FET which is formed on the semiconductor substrate and changes a threshold voltage depending on an OFF state and an ON state,
the semiconductor element includes:
an insulating film configured to be formed on the semiconductor substrate;
a charge trap film configured to be formed on the insulating film; and
a gate electrode configured to be arranged to be in contact with the charge trap film,
wherein the charge trap film is an SiNx film, the x representing a mole ratio of N to Si and having a value within a range of $0.67 < x < 1.33$,
the charge trap film comprises a film thickness Tct having a value within a range of $0.34$ nm $< T_{ct} < 7$ nm,
the insulating film is an SiON film in which a mole ratio of N to a sum of Si, O, and N expressed as $\{N/(Si+O+N)\}$ is a value within a range of $0 \leq \{N/(Si+O+N)\} < 0.35$, and
the insulating film comprises a film thickness Tox comprising a value within a range of $0.64$ nm $< T_{ox}$,
wherein when the semiconductor element is an n-type FET, the charge trap film sets the threshold voltage to a first voltage level when the semiconductor element is in the OFF state by capturing electrons from the gate electrode and becoming a neutral state, and sets the threshold voltage to a second voltage level lower than the first voltage level when the semiconductor element is in the ON state by transferring electrons to the gate electrode, and
when the semiconductor element is a p-type FET, the charge trap film sets an absolute value of the threshold voltage to a third voltage level when the semiconductor element is in the OFF state by transferring extra electrons to the gate electrode and becoming the neutral state, and sets the absolute value of the threshold voltage to a fourth voltage level lower than the third voltage level when the semiconductor element is in the ON state by capturing electrons from the gate electrode.

18. The semiconductor device of claim 17, further comprising:
a first n-type FET and a first p-type FET connected in series between a first power-supply line and a second power-supply line;
a second n-type FET and a second p-type FET connected in series between the first power-supply line and the second power-supply line;
a first junction disposed between the first n-type FET and the first p-type FET;
a second junction disposed between the second n-type FET and the second p-type FET;
a first data node connected to a gate of the second n-type FET, a gate of the second p-type FET, and the first junction;
a second data node connected to a gate of the first n-type FET, a gate of the first p-type FET, and the second junction;

a third n-type FET connected between the first data node and a first data line; and a fourth n-type FET connected between the second data node and a second data line, wherein each of the first n-type FET and the second n-type FET comprises a layer structure same as the semiconductor element, and the charge trap film and the insulating film in each of the first n-type FET and the second n-type FET are same as the semiconductor element in material, composition range, and film thickness range.

* * * * *